(12) United States Patent
Tsuchiya et al.

(10) Patent No.: US 9,046,584 B2
(45) Date of Patent: Jun. 2, 2015

(54) BATTERY VOLTAGE DETECTOR HAVING PULL-UP RESISTOR

(75) Inventors: Shingo Tsuchiya, Utsunomiya (JP); Seiji Kamata, Utsunomiya (JP)

(73) Assignee: KEIHIN CORPORATION (JP)

( * ) Notice: Subject to any disclaimer, the term of this patent is extended or adjusted under 35 U.S.C. 154(b) by 370 days.

(21) Appl. No.: 13/429,996

(22) Filed: Mar. 26, 2012

(65) Prior Publication Data
US 2012/0249074 A1  Oct. 4, 2012

(30) Foreign Application Priority Data
Mar. 30, 2011  (JP) .................................. 2011-075305

(51) Int. Cl.
*H02J 7/00* (2006.01)
*G01R 31/36* (2006.01)

(52) U.S. Cl.
CPC .......... *G01R 31/3658* (2013.01); *G01R 31/362* (2013.01)

(58) Field of Classification Search
CPC .... Y02E 60/12; Y02E 60/13; G01R 31/3658; H02J 7/0021; H02J 7/0016; H02J 7/345; Y02T 10/7055; Y02T 10/7022; H02M 3/33507; H02M 3/07; H01G 9/155
USPC ....................................................... 320/116
See application file for complete search history.

(56) References Cited

U.S. PATENT DOCUMENTS

| 4,516,035 | A * | 5/1985 | Rhoads et al. ................ 307/66 |
| 2002/0121880 | A1 * | 9/2002 | Yamanaka et al. ............ 320/134 |
| 2006/0267557 | A1 * | 11/2006 | Nakano et al. ................ 320/134 |
| 2007/0252744 | A1 * | 11/2007 | Takeuchi ...................... 341/155 |
| 2008/0036424 | A1 * | 2/2008 | Saigo ........................... 320/136 |

FOREIGN PATENT DOCUMENTS

| CN | 1208284 A | 2/1999 |
| CN | 1595761 A | 3/2005 |
| CN | 101493483 A | 7/2009 |
| CN | 101587172 A | 11/2009 |
| JP | 2000183739 A | 6/2000 |

(Continued)

OTHER PUBLICATIONS

Japanese Notice of Reasons for Rejection corresponding to Application No. 2011-075305; Date of Mailing: Nov. 11, 2014, with English translation.

(Continued)

*Primary Examiner* — Arun Williams
(74) *Attorney, Agent, or Firm* — Cantor Colburn LLP

(57) ABSTRACT

A battery voltage detector includes, but is not limited to: a voltage detection circuit; and a voltage processor. The voltage detection circuit includes, but is not limited to: a capacitor configured to be charged by a battery cell; a pair of output terminals; an output switch; and a voltage processor. While the capacitor is charged, the output switch is configured to be off-state and insulate the capacitor from the pair of the output terminals. After the capacitor is charged, the output switch is configured to be on-state and connect the capacitor to the pair of the output terminals. The voltage processor is configured to obtain, as a cell voltage, a voltage between the output terminals of the voltage detection circuit while the output switch is on-state. A high-potential output terminal of the pair of the output terminals is connected to a power line via a pull-up resistor.

2 Claims, 3 Drawing Sheets

(56) References Cited

FOREIGN PATENT DOCUMENTS

| | | |
|---|---|---|
| JP | 2001244813 A | 9/2001 |
| JP | 2002-291167 A | 10/2002 |
| JP | 2010256335 A | 11/2010 |

OTHER PUBLICATIONS

Chinese Office Action corresponding to Application No. 201210085285.4; Date of Mailing: Jan. 26, 2015, with partial English translation.

* cited by examiner

BATTERY VOLTAGE DETECTOR HAVING PULL-UP RESISTOR

BACKGROUND OF THE INVENTION

1. Field of the Invention

The present invention relates to a battery voltage detector.

Priority is claimed on Japanese Patent Application No. 2011-075305, filed Mar. 30, 2011, the content of which is incorporated herein by reference.

2. Description of the Related Art

As known, a vehicle, such as an electric car or a hybrid car, is provided with a motor, and a high-voltage and high-capacity battery that supplies power to the motor. The battery includes multiple battery cells connected in series. The battery cell includes a lithium-ion battery, a nickel-metal hydride battery, or the like. In related art, a voltage balance control of monitoring and equalizing cell voltages of the battery cells is performed to maintain the performance of the battery.

It is mainstream to use a flying-capacitor-type voltage detection circuit in order to detect a cell voltage because dedicated insulating power or insulating elements are unnecessary for the flying-capacitor-type voltage detection circuit. The flying-capacitor-type voltage detection circuit has a demerit in that a cell voltage of a battery cell to be measured is detected lower than a true value if a leak current of a flying capacitor or a sampling switch increases due to time degradation. Consequently, a precise cell voltage cannot be obtained, thereby causing a decrease in the precision of cell balance control in some cases.

To overcome the above demerit of the flying-capacitor-type voltage detection circuit, Japanese Patent Laid-Open Publication No. 2002-291167 discloses technique of detecting a cell voltage of each battery cell to be measured in different timing using a flying-capacitor-type voltage detection circuit, and estimating a voltage immediately after the start of charging the flying capacitor (i.e., a cell voltage regarded as a true value), based on the voltage attenuation characteristics of the cell voltage obtained as a result of the detection.

The detection value of the cell voltage, which is obtained from the flying-capacitor-type voltage detection circuit, includes not only errors caused by the aforementioned increase in leak current due to time degradation of the flying capacitor and each switch, but also drift errors caused by variations with time of resistance values of an input resistance of the flying capacitor, an on-resistance and an input circuit resistance of each switch, and the like. The drift errors are factors that cause the cell voltage to be detected to be lower than the true value.

The present invention has been made in view of the above situations. An object of the present invention is to provide a battery voltage detector that reduces drift errors caused by variations with time of resistance values of various resistances included in the cell voltage detection circuit, thereby enhancing precision of detecting a cell voltage.

SUMMARY

To solve the above problem, a battery voltage detector according to one aspect of the present invention includes, but is not limited to: a voltage detection circuit; and a voltage processor. The voltage detection circuit includes, but is not limited to: a capacitor configured to be charged by a battery cell; a pair of output terminals; an output switch; and a voltage processor. While the capacitor is charged, the output switch is configured to be off-state and insulate the capacitor from the pair of the output terminals. After the capacitor is charged, the output switch is configured to be on-state and connect the capacitor to the pair of the output terminals. The voltage processor is configured to obtain, as a cell voltage, a voltage between the output terminals of the voltage detection circuit while the output switch is on-state. A high-potential output terminal of the pair of the output terminals is connected to a power line via a pull-up resistor.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a battery voltage detector. The size, the thickness, and the like of each illustrated portion might be different from those of each portion of an actual battery voltage detector.

Those skilled in the art will recognize that many alternative embodiments can be accomplished using the teachings of the present invention and that the present invention is not limited to the embodiments illustrated herein for explanatory purposes.

Hereinafter, an embodiment of the present invention is explained with reference to the drawings.

Figure 1:
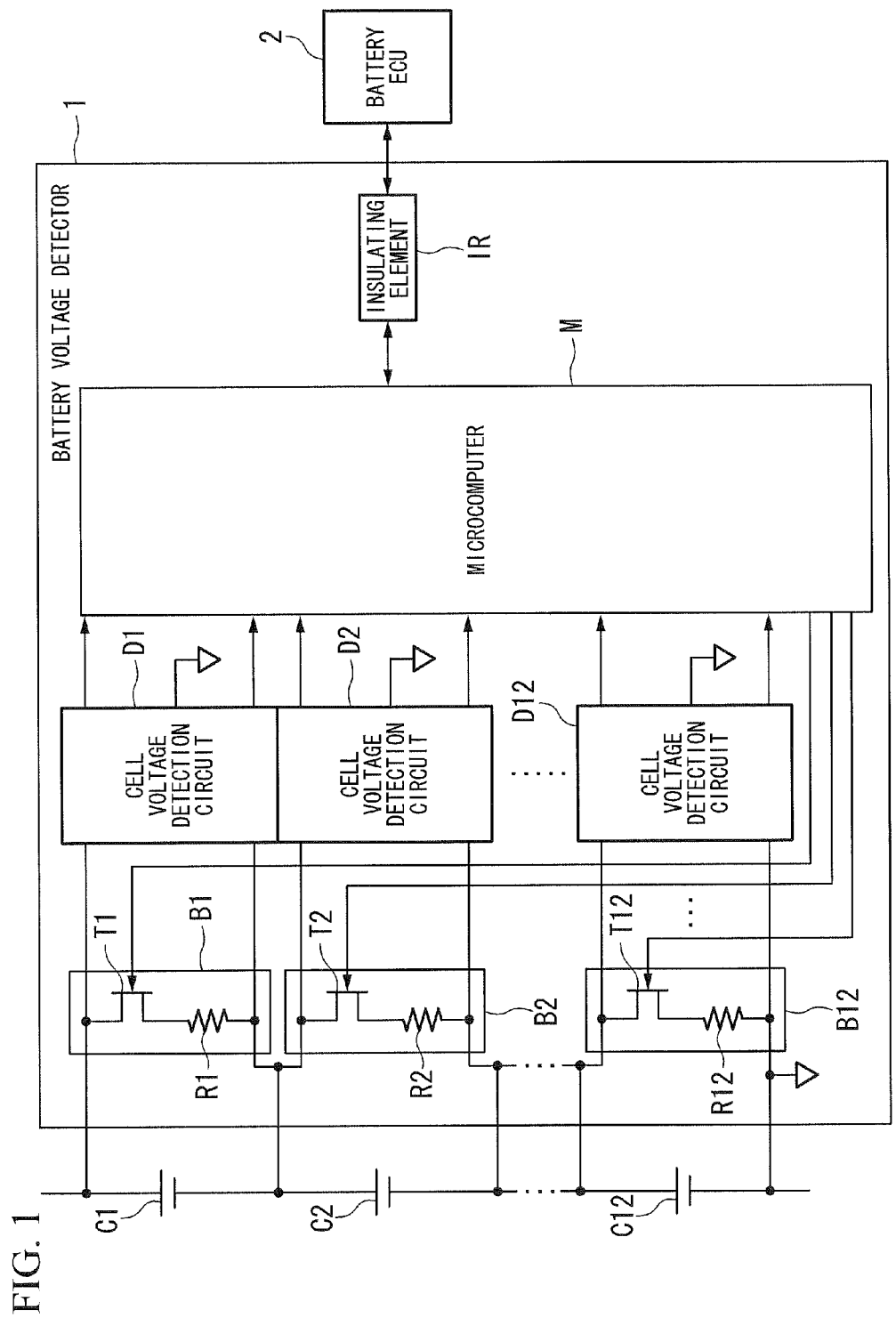
FIG. 1 schematically illustrates a configuration of a battery voltage detector 1 according to an embodiment of the present invention.

FIG. 1 schematically illustrates a battery voltage detector 1 according to the present embodiment. As shown in FIG. 1, the battery voltage detector 1 is an ECU (Electronic Control Unit) that detects cell voltages of twelve battery cells C1 to C12 included in a battery and performs voltage balance control on the battery cells C1 to C12 (equalization of the cell voltages). The battery voltage detector 1 includes: twelve bypass circuits B1 to B12; twelve cell voltage detection circuits D1 to D12; a microcomputer (voltage processor) M; and an insulating element IR.

Each of the bypass circuits B1 to B12 includes a bypass resistor and a switching element which are connected in series. The switching element includes a transistor or the like. The bypass circuits B1 to B12 are connected in parallel to the battery cells C1 to C12, respectively. In FIG. 1, reference symbols R1 to R12 denote bypass resistors included in the bypass circuits B1 to B12, respectively. Reference symbols T1 to T12 denote switching elements included in the bypass circuits B1 to B12, respectively.

Figure 2A:
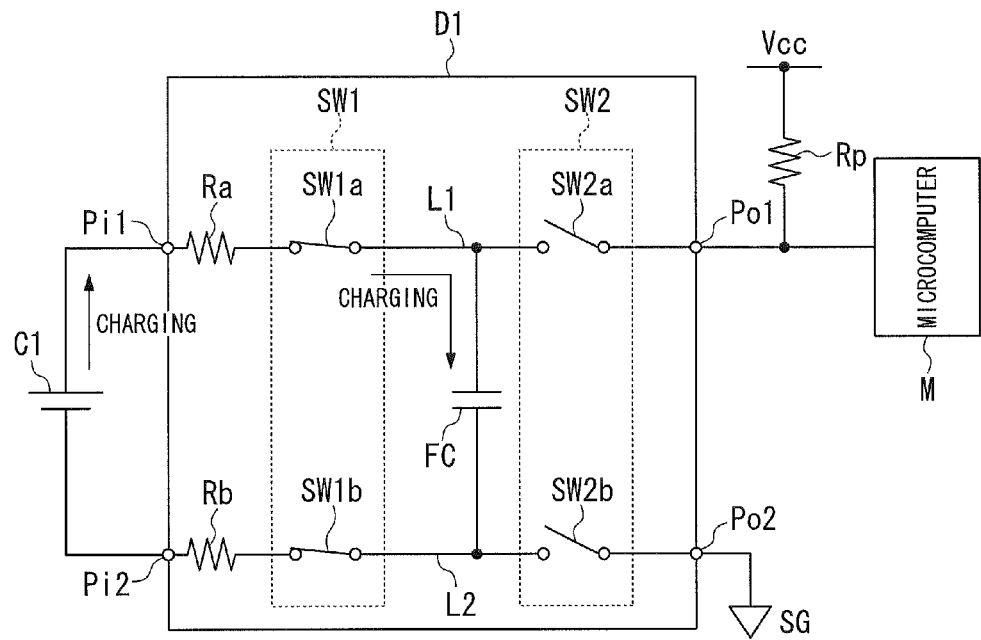
FIG. 2A illustrates a circuit configuration of the cell voltage detection circuit D1 when SW1 is on-state and SW2 is off-state.
Figure 2B:
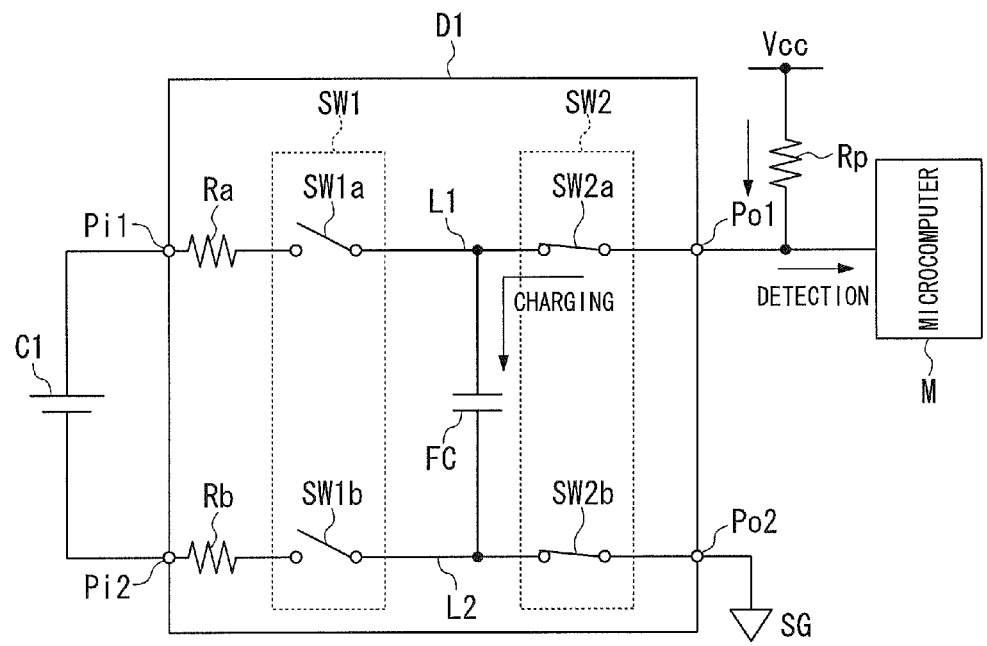
FIG. 2B illustrates a circuit configuration of the cell voltage detection circuit D1 when SW1 is off-state and SW2 is on-state.

The cell voltage detection circuits D1 to D12 are provided respectively for the battery cells C1 to C12 connected in series, which are called single-flying-capacitor-type voltage detection circuits. FIGS. 2A and 2B illustrate circuit configurations of the cell voltage detection circuit D1 that detects a cell voltage of the battery cell C1. The other cell voltage detection circuits D2 to D12 have the same configuration as that of the cell voltage detection circuit D1. Therefore, only the cell voltage detection circuit D1 is explained in detail, and explanations of the other cell voltage detection circuits D2 to D12 are omitted, here.

In FIGS. 2A and 2B, reference symbol Pi1 denotes a first input terminal connected to a positive electrode terminal of the battery cell C1. Reference symbol Pi2 denotes a second input terminal connected to a negative electrode terminal of the battery cell C1. Reference symbol Po1 denotes a first output terminal connected to an input port of the microcomputer M (i.e., a port connected to an A/D (analog to digital) convertor). Reference symbol Po2 is a second output terminal connected to a common potential line (for example, a ground line SG) in the battery voltage detector 1. The first input terminal Pi1 and the second input terminal Pi2 correspond to a pair of input terminals according to the present embodiment. The first output terminal Po1 and the second output terminal Po2 correspond to a pair of output terminals according to the present embodiment.

Reference symbol FC is a flying capacitor connected between a high potential line L1 and a low potential line L2. The high potential line L1 connects the first input terminal Pi1 and the first output terminal Po1. The low potential line L2 connects the second input terminal Pi2 and the second output terminal Po2. Reference symbol SW1 is an input switch inserted on the left side of the flying capacitor FC connected between the high potential line L1 and the low potential line L2.

Specifically, the input switch SW1 includes a first input switch SW and a second input switch SW1b. The first input switch SW1a is inserted onto the high potential line L1 on the side of the first input terminal Pi1 with respect to the flying capacitor FC. The second input switch SW1b is inserted onto the low potential line L2 on the side of the second input terminal Pi2 with respect to the flying capacitor FC. Additionally, an input resistor Ra is inserted onto the high potential line L1 between the first input terminal Pi1 and the first input switch SW1a. An input resistor Rb is inserted onto the low potential line L2 between the second input terminal Pi2 and the second input switch SW1b.

The input switch SW1 turns on while the flying capacitor FC is charged, and connects the flying capacitor FC to the input terminals (i.e., to the battery cell C1). Then, the input switch SW1 turns off after the flying capacitor FC is charged, and insulates the flying capacitor FC from the input terminals (i.e., from the battery cell C1).

Reference symbol SW2 is an output switch inserted on the right side of the flying capacitor FC connected between the high potential line L1 and the low potential line L2. Specifically, the output switch SW2 includes a first output switch SW2a and a second output switch SW2b. The first output switch SW2a is inserted onto the high potential line L1 on the side of the first output terminal Po1 with respect to the flying capacitor FC. The second output switch SW2b is inserted onto the low potential line L2 on the side of the second output terminal Po2 with respect to the flying capacitor FC.

The output switch SW2 turns off while the flying capacitor FC is charged, and insulates the flying capacitor FC from the output terminals (i.e., from the microcomputer M). Then, the output switch SW2 turns on after the flying capacitor FC is charged, and connects the flying capacitor FC to output terminals (i.e., to the microcomputer M).

A high-potential output terminal of the pair of output terminals (the first output terminals Po1 and the second output terminal Po2) included in the cell voltage detection circuit D1, which is the first output terminal Po1, is connected to a power line (for example, a 5V Vcc line) in the battery voltage detector 1 via a pull-up resistor Rp. Although not shown, the power line is connected to a reference power source that generates a stable reference voltage (Vcc) to be a reference for circuit operation. Thus, the first output terminal Po1 is connected to the power line via the pull-up resistor Rp between the cell voltage detection circuit D1 and the microcomputer M.

With reference back to FIG. 1, the microcomputer M is a microcomputer including a memory such as a ROM, a RAM, or the like, a CPU (Central Processing Unit), an A/D (analog to digital) conversion circuit, an input/output interface, and the like.

The microcomputer M obtains, as a cell voltage, a voltage between the output terminals of each of the cell voltage detection circuits D1 to D12 (i.e., a voltage between the first output terminal Po1 and the second output terminal Po2) while the output switch SW2 of each of the cell voltage detection circuits D1 to D12 is on-state. Then, the microcomputer M stores, in an internal memory (for example, a RAM), data indicating a relationship between an identification number and the cell voltage of each of the battery cells C1 to C12, as results of the cell voltage detection.

Additionally, the microcomputer M can communicate with the battery ECU2 that is an upper controller, via the insulating element IR. The microcomputer M transmits, to the battery ECU2, the results of the cell voltage detection stored in the internal memory. The battery ECU2 monitors the states of the battery cells C1 to C12 (the balance states of the cell voltages) based on the results of the cell voltage detection received from the microcomputer M. If the battery ECU2 finds a battery cell that is higher in cell voltage than the other battery cells, the battery ECU2 specifies that battery cell as a cell requiring discharge (discharge requiring cell), and transmits the result of the specification to the microcomputer M.

Upon receiving the result of specifying the discharge requiring cell from the battery ECU2, the microcomputer M controls the switching element of the bypass circuit connected to the discharge requiring cell (i.e., the cell balance control).

Hereinafter, operation of the battery voltage detector 1 having the aforementioned configuration (cell voltage detection operation) is explained in detail with reference to FIGS. 2A, 2B, and 3. For simplification of explanations, only the cell voltage detection circuit D1 that detects a cell voltage of the battery cell C1 is explained. Operations of the other cell voltage detection circuits D2 to D12 are similar to that of the cell voltage detection circuit D1, and therefore explanations thereof are omitted here.

Figure 3:
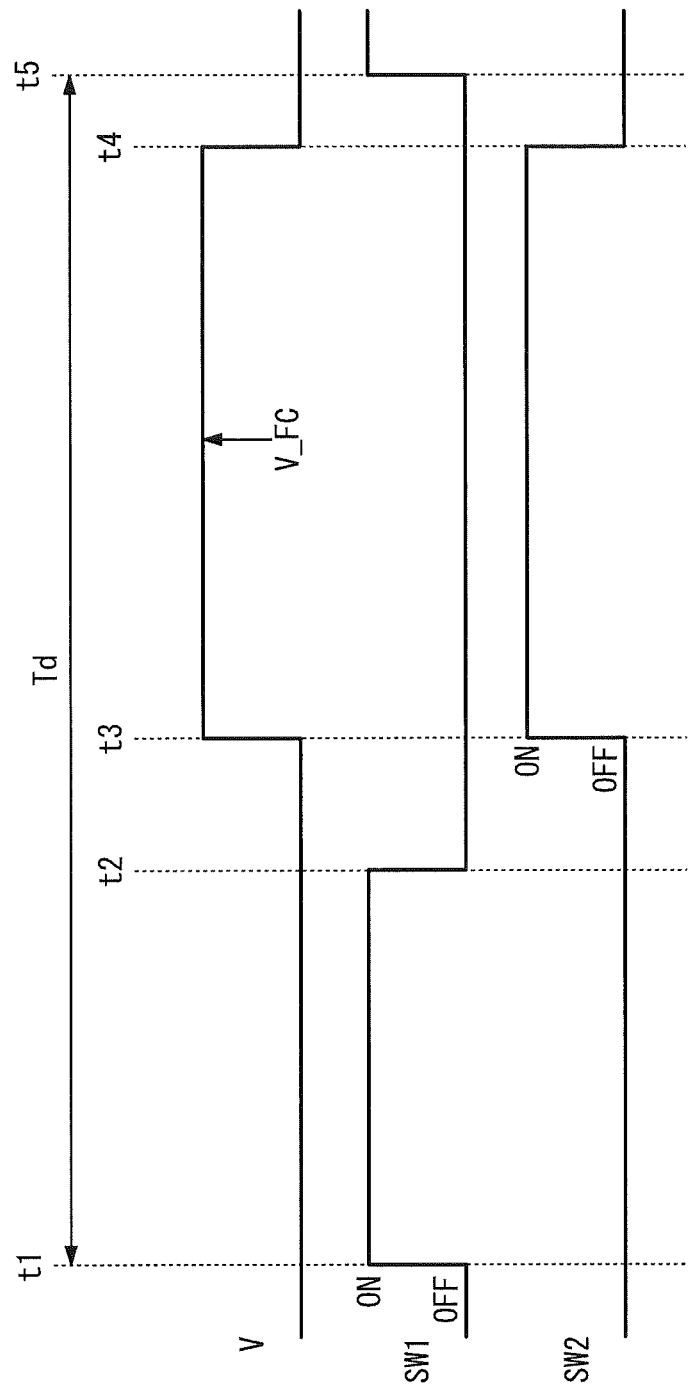
FIG. 3 is a timing chart illustrating operation of the battery voltage detector 1.

FIG. 3 is a timing chart illustrating time relationship among a voltage V between the output terminals of the cell voltage detection circuit D1 which is obtained by the microcomputer M, the on/off state of the input switch SW1 (the first input switch SW1a and the second input switch SW1b), and the on/off state of the output switch SW2 (the first output switch SW2a and the second output switch SW2b).

As shown in FIG. 3, charging of the flying capacitor FC with a voltage detection period Td is assumed to start at time t1. The input switch SW1 (SW1a and SW1b) of the cell voltage detection circuit D1 becomes on-state at the time t1. On the other hand, the output switch SW2 (SW2a and SW2b) becomes off-state at the time t1. Thereby, the battery cell C1 starts the charging of the flying capacitor FC (see FIG. 2A).

Then, the input switch SW1 becomes off-state at time t2 which is a given time after the time t1. The given time is a duration that is enough for the flying capacitor FC to be sufficiently charged. The flying capacitor FC is insulated from the output terminal (the first output terminal Po1 and the second output terminal Po2) for the charging duration from the time t1 to the time t2 (i.e., while the output switch SW2 is off-state).

After the flying capacitor FC is charged, the output switch SW2 is on-state from time t3 to time t4 (the input switch SW1 is off-state). The flying capacitor FC is electrically connected to the output terminal (the first output terminal Po1 and the second output terminal Po2) for the duration from the time t3 to the time t4 (i.e., while the output switch SW2 is on-state). For the duration from the time t3 to the time t4, the microcomputer M can obtain the voltage V between the output terminals of the cell voltage detection circuit D1 (i.e., the voltage between the terminals of the flying capacitor FC).

At this time, the first output terminal Po1 is connected to the power line (Vcc line) via the pull-up resistor Rp. For this reason, the flying capacitor FC is recharged by the reference voltage Vcc (5V), and thereby the voltage between the terminals of the flying capacitor FC becomes slightly higher (for example, approximately +1 mV) than the voltage value immediately after being charged by the battery cell C1 (see FIG. 2B).

For the duration from the time t3 to the time t4 (while the output switch SW2 is on-state), the microcomputer M obtains the voltage V between the output terminals of the cell voltage detection circuit D1, as a cell voltage V_FC of the battery cell C1. Then, the microcomputer M causes the A/D conversion circuit to convert the cell voltage V_FC into digital data which can be processed by the CPU. Then, the microcomputer M stores in the internal memory (for example, a RAM), the digital data as the result of the cell voltage detection for the voltage cell C1.

The cell voltage V_FC finally obtained from the cell voltage detection circuit D1 in this manner is higher than the true value of the cell voltage (the voltage between the terminals of the flying capacitor FC immediately after the charging by the battery cell C1). In other words, even if the voltage between the terminals of the flying capacitor FC immediately after the charging by the battery cell C1 decreases due to drift errors caused by variations with time of resistance values and becomes lower than the true value, the decreased amount of voltage is cancelled when the voltage between the terminals of the flying capacitor FC (the voltage V between output terminals) is obtained by the microcomputer M, thereby obtaining the cell voltage V_FC close to the true value.

The battery voltage detector 1 repeatedly performs the series of operation explained above with the voltage detection period Td, thereby obtaining results of the cell detection for the respective cells C1 to C12. Then, the battery voltage detector 1 transmits the results of the cell voltage detection to the battery ECU2. Upon receiving the result of specifying a discharge requiring cell from the battery ECU2, the battery voltage detector 1 performs cell balance control. Here, the on/off states of the input switch SW1 and the output switch SW2 may be controlled by the microcomputer M or another control circuit provided separately.

As explained above, according to the present embodiment, the drift errors caused by variations with time of resistance values of an input resistance of the flying capacitor, an on-resistance and an input circuit resistance of each switch, and the like can be reduced with a simple configuration. Consequently, a cell voltage close to the true value can be precisely detected. Additionally, the amount of current from the power line Vcc can be limited by setting a resistance value of the pull-up resistor Rp. Therefore, the resistance value of the pull-up resistor Rp is set so as not to affect sampling of a cell voltage for the sampling duration, thereby confining the small amount of current in the flying capacitor FC.

It is apparent that the present invention is not limited to the above embodiments, and may be modified and changed without departing from the scope and spirit of the invention. For example, it has been explained in the first embodiment that the battery voltage detector 1 performs cell voltage detection with respect to the twelve battery cells C1 to C12. However, the number of the battery cells C1 to C12 is not limited to twelve.

Additionally, it has been explained in the first embodiment that the twelve cell voltage detection circuits D1 to D12 are provided respectively for the battery cells C1 to C12. However, only one cell voltage detection circuit may be provided. In this case, both terminals of each of the battery cells C1 to C12 may be sequentially connected, using a multiplexor or the like, to the input terminals (the first input terminal Pi1 and the second input terminal Pi2) of each of the cell voltage detection circuits, thereby sequentially detecting a cell voltage of each of the battery cells C1 to C12. If a multiplexor is used, the input switch SW1 is unnecessary.

As used herein, the following directional terms "left" and "right" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

What is claimed is:

1. A battery voltage detector comprising:
    a plurality of cell voltage detection circuits connected in parallel to respective ones of a plurality of battery cells, each of the plurality of cell voltage detection circuits comprising a capacitor connected in parallel to one of the plurality of battery cells and being configured to be charged by the one of the plurality of battery cells;
    a voltage processor connected to the plurality of cell voltage detection circuits and configured to detect a charged voltage of the capacitor for each of the plurality of voltage detection circuits; and
    a plurality of pull-up resistors each connected between the voltage processor and one of the plurality of voltage detection circuits and each configured to pull-up the charged voltage of the capacitor to a fixed voltage.

2. The battery voltage detector according to claim 1, wherein the plurality of pull-up resistors are connected to a reference power source.

* * * * *